United States Patent [19]

Trinh

[11] Patent Number: 5,204,637
[45] Date of Patent: Apr. 20, 1993

[54] POWER DETECTION TECHNIQUE FOR AUTOMATIC AMPLIFIER POWER CONTROL

[75] Inventor: Lanh Trinh, Carlsbad, Calif.

[73] Assignee: Hughes Aircraft Company, Los Angeles, Calif.

[21] Appl. No.: 870,070

[22] Filed: Apr. 17, 1992

[51] Int. Cl.[5] ............................................. H03G 3/30
[52] U.S. Cl. ................................. 330/129; 330/131; 330/284
[58] Field of Search ................ 330/129, 131, 140, 279, 330/282, 284; 455/115, 126, 234, 240

[56] References Cited

U.S. PATENT DOCUMENTS

| | | | |
|---|---|---|---|
| 4,523,155 | 6/1985 | Walczak et al. | 330/279 |
| 4,602,218 | 7/1986 | Vilmur et al. | 330/279 |
| 4,631,491 | 12/1986 | Smithers | 455/126 |
| 4,709,403 | 11/1987 | Kikuchi | 330/12 X |
| 4,760,347 | 7/1988 | Li et al. | 330/127 |
| 4,870,698 | 9/1989 | Katsuyama et al. | 455/67 |
| 5,054,116 | 10/1991 | Davidson | 455/126 |

OTHER PUBLICATIONS

Designer's casebook "Schottky diode pair makes an rf detector stable" by Roland J. Turner, May 2, 1974.

*Primary Examiner*—Steven Mottola
*Attorney, Agent, or Firm*—William J. Streeter; Wanda K. Denson-Low

[57] ABSTRACT

A controlled-output power amplifier (50) is provided having a wide dynamic range in a plurality of output power levels. The controlled-output amplifier (50) includes an amplifier (12) for receiving an input signal (14) and for providing an output signal (16) therefrom. A power detector (24) is employed for rectifying a sample signal and providing a DC output signal (26) therefrom. An active variable coupling network (52) which preferably includes a varactor (62) is connected between the output of the amplifier (12) and the power detector (24). The variable coupling network (52) receives the amplifier output signal (16) and further receives an isolation voltage (54) and adjusts the amount of isolation between the amplifier (12) and the power detector (24). For high output signals, the isolation voltage (54) causes a high isolation thereby causing less power to be transferred to the power detector (24). The isolation voltage (54), similarly, decreases the isolation for low output signals such that more power is transferred to the power detector (24). The DC output signal (26) is then compared with a fixed voltage reference (30). The voltage comparison provides an error voltage (34) which is used to adjust the gain of amplifier (12) so that the output signal (16) of the amplifier (12) is set to a desired magnitude.

11 Claims, 4 Drawing Sheets

POWER DETECTION TECHNIQUE FOR AUTOMATIC AMPLIFIER POWER CONTROL

BACKGROUND OF THE INVENTION

1. Technical Field

The present invention relates to power amplifiers and, more particularly, to a power control circuit and technique for automatically controlling the output power of an amplifier over a wide dynamic range.

2. Discussion

Power amplifiers are well known electronic devices used for various applications including radio transmit/receive communication systems. Power amplifiers employed for radio communications are generally referred to as radio frequency (RF) power amplifiers. For radio communications, it is generally desirable to employ an RF source which provides a plurality of constant power output levels. Techniques have been devised for providing automatic power control of such amplifiers to maintain a constant power output among a plurality of power settings. As an example, the cellular radio transmitter operates at one of eight assigned output power settings which are generally separated 4 dB from one another. In addition, it is usually required that the cellular radio transmitter maintain its output power within a +2/−4 dB tolerance.

Conventional techniques for providing automatic power control of the output of an amplifier generally involve measuring the output power of the amplifier with a diode power detector connected directly to the output of the amplifier. This connection is typically made with a passive device such as a small capacitor or a directional coupler, both of which provide a sample of the amplifier's output power. The sampled power is rectified by a detecting diode in the power detector to provide a DC voltage signal which has a magnitude that is proportional to the output power of the amplifier. The DC voltage signal is conventionally compared with a setpoint voltage in a comparator circuit to provide an error voltage. The resulting error voltage is then used to adjust the gain of the amplifier so as to obtain the desired amplifier power output.

Such conventional power control techniques generally have a limited reliable detection range due to the narrow amplitude range of the detecting diode. The detection range is usually bounded at the high end by diode saturation, and at the low end by diode temperature dependency characteristics. Diode saturation occurs when an increase in the amplifier's power no longer produces a corresponding increase in the detected diode voltage, resulting in an error in the power reading. In an attempt to avoid this problem, one type of conventional technique includes boosting the saturation point of the diode detector by increasing the bias current to the diode. However, this technique still suffers from the diode temperature effect at the low end power.

Typical power control techniques may generally include a diode power detector which employs a schottky barrier type of detector diode. Generally, diodes such as the schottky barrier type incur a temperature induced error when the voltage detected is relatively small, such as on the order of tens of millivolts. In particular, the schottky barrier type of diode exhibits a silicon semiconductor junction characteristic which is temperature dependent at a rate of approximately two millivolts per degree centigrade. At higher operating power, the voltage across the diode is relatively large as compared with the temperature induced error so that the temperature error factor becomes somewhat insignificant.

A second conventional power control technique employs a second diode having characteristics which precisely match that of the detector diode. This technique operates to counteract the temperature effect in the diode detector. The second diode does not operate as a power detector but merely operates to compensate for the temperature error of the detecting diode. Generally, the second diode's temperature induced voltage is then subtracted out of the detector diode's voltage to provide a corrected power reading. However, this method which involves a closely matched diode pair is relatively expensive and often requires that the diode pair be hand selected for purposes of providing proper matching. In addition, this conventional technique does not offset the diode saturation effects as discussed earlier.

Another prior art method utilizes a logarithmic amplifier for compressing the dynamic range of the power signal received by the power detector. As a result, the logarithmic amplifier narrows the dynamic range that the detector has to cover. However, a logarithmic amplifier is generally a relatively complicated and expensive electronic device. In addition, the logarithmic amplifier's gain typically varies considerably with temperature. Furthermore, the logarithmic amplifier compresses the detection dynamic range so that the detected voltage range is relatively small in comparison to the large power control range. As a result, this causes the control loop to become highly sensitive such that control instability may result therefrom.

It is therefore desirable to obtain a power control technique for automatically controlling the power output of an amplifier which is not limited to the dynamic range of a power detector. More particularly, it is desirable to obtain such a technique that extends the upper and lower limits of a diode power detector's operating range without suffering from the prior art limitations.

SUMMARY OF THE INVENTION

In accordance with the teachings of the present invention, an amplifier power control circuit is provided for allowing automatic power control of the output of an amplifier over a wide dynamic range. The circuit includes an amplifier having an input and an output for providing an output signal therefrom. The circuit further includes a power detector for receiving a sample signal and rectifying the sample signal to thereby provide a DC output signal. A variable coupling network is connected between the output of the amplifier and the power detector for receiving the amplifier output signal in addition to an isolation control signal. The variable coupling network provides a variable amount of isolation between the amplifier output and the power detector to thereby provide the sample signal to the power detector. A comparator is further provided for comparing the DC output signal with a reference voltage to provide an error voltage. The amplifier output signal is then adjusted in relation to the error voltage so as to compensate for any deviation from the desired output.

BRIEF DESCRIPTION OF THE DRAWINGS

Other objects and advantages of the present invention will become apparent to those skilled in the art upon reading the following detailed description and upon reference to the drawings in which.

FIG. is a block diagram which illustrates automatic power control of an amplifier in accordance with the prior art.

DETAILED DESCRIPTION OF THE PREFERRED EMBODIMENT

Figure 1:
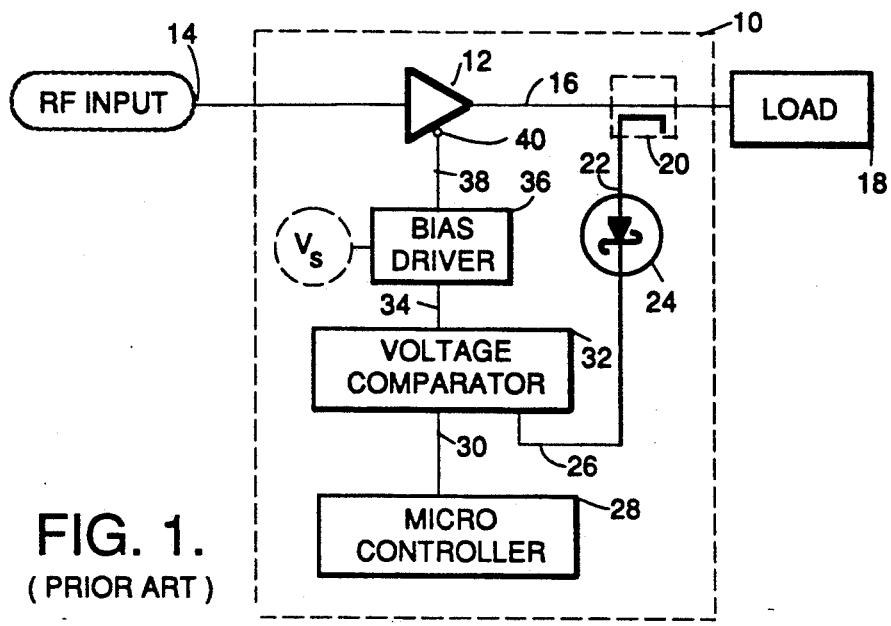

Turning now to FIG. 1, a conventional controlled-output amplifier 10 is shown therein in accordance with the prior art. The conventional controlled-output amplifier 10 includes a controllable gain amplifier 12 having an input for receiving an input signal 14 and an output for providing an amplified output signal 16. The output of the controllable gain amplifier 12 is generally connected to a load 18 for providing the output signal 16 thereto.

The conventional controlled-output amplifier 10 includes a diode power detector 24 coupled to the output of the controllable gain amplifier 12 via a directional coupler 20. The directional coupler 20 receives the output signal 16 from the controllable gain amplifier 12 and diverts a proportional amount of power of the output power 16 as a sample signal 22 to the input of the diode power detector 24.

The diode power detector 24 includes a diode which rectifies the incoming sample signal 22 to thereby provide a direct current (DC) output signal 26. A voltage comparator 32 compares the DC output signal 26 with a voltage reference 30 which is provided by a microcontroller 28. The voltage comparator 32 provides as an output an error voltage 34. A bias driver 36 receives the error voltage 34 in addition to a supply voltage $V_s$ and provides as an output, a bias control signal 38. The bias control signal 38 is input to a bias control input 40 of the controllable gain amplifier 12. As a result, the bias control signal 38 adjusts the gain of the controllable gain amplifier 12 such that the desired power output signal 16 is obtained.

Figure 2:
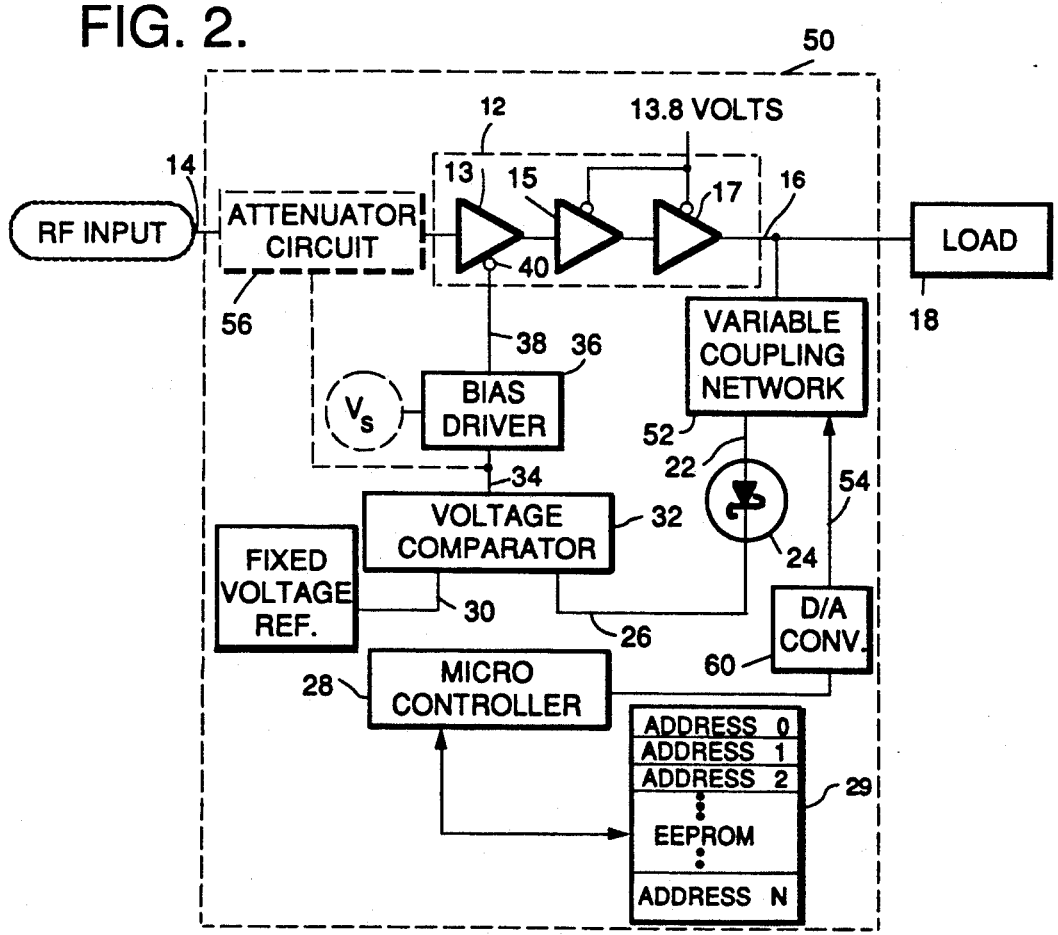
FIG. 2 is a block diagram which illustrates automatic power control of the output of an amplifier in accordance with the present invention.

FIG. 2 illustrates an automatic controlled-output amplifier 50 in accordance with the present invention. The controlled-output amplifier 50 includes an amplifier 12 having an input for receiving an RF power input signal 14 and for providing an amplified RF output signal 16. The amplifier 12 may include a typical controllable gain type of amplifier having a bias input 40 for adjusting the gain thereof. Such an amplifier may include any off-the-shelf amplifier such as the type manufactured by Motorola, having model No. MHW806. However, this invention does not necessarily require an amplifier having a bias input 40, so long as some sort of adjustable alternative is provided. As an alternative, an attenuation device may be used to adjust the amplitude of the input signal 14 so as to cause a change in the amplitude of the output signal 16.

The amplifier 12 shown includes first, second and third amplifier stages 13, 15, and 17, respectively. Gain control is applied to a bias control input 40 on the first amplifier stage 13 of amplifier 12. The second and third amplifier stages 15 and 17 have a fixed gain and are supplied directly from a 13.8 volt source.

The output of the amplifier 12 is connected to a load 18 for providing the controlled power output signal 16 thereto. One example of the load 18 may include a transmit antenna for a radio system. A variable coupling network 52 is further coupled to the output of the amplifier 12 which allows a portion of the output signal 16 to be diverted therethrough. The variable coupling network 52 further receives an isolation control voltage signal 54 from a microcontroller 28 via a Digital-to-Analog (D/A) converter 60. The microcontroller 28 includes an EEPROM (electrically erasable programmable read only memory) 29 which has a plurality of memory locations therein. The variable coupling network 52 has an output connected to the input of a diode power detector 24. For each of a plurality of output levels of amplifier 12, a corresponding memory location of the EEPROM 29 is used for setting the necessary amount of isolation in the variable coupling network 52. As such, for a cellular radio system having eight output levels, an EEPROM device 29 having eight memory locations would be employed.

Figure 3:
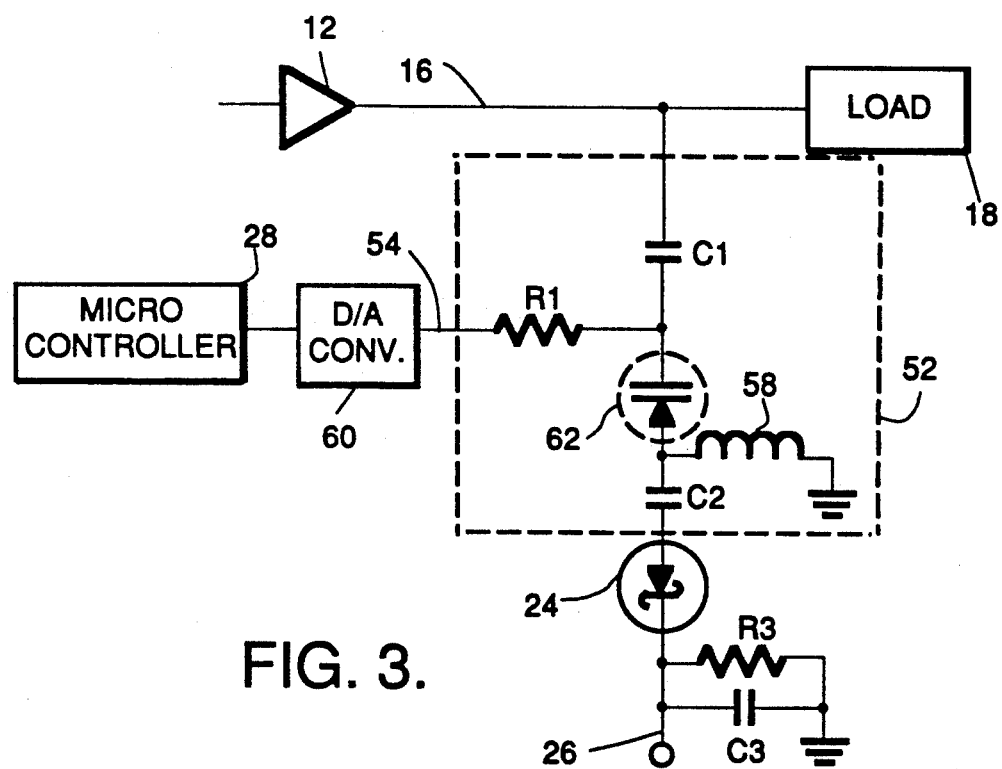
FIG. 3 is a circuit diagram which illustrates the preferred embodiment of the variable coupling network.

The variable coupling network 52 is essentially a variable, active coupling circuit such as that shown in FIG. 3. The variable coupling network 52 samples the output power 16 from the amplifier 12, and in conjunction with the isolation control voltage signal 54 provides a settable amount of isolation between the output of amplifier 12 and the diode power detector 24. When operating at high power settings, the variable coupling network 52 is directed by the isolation control voltage signal 54 via microcontroller 28 and Digital-to-Analog converter 60 to provide for a loose coupling between the output of amplifier 12 and the diode power detector 24 to thereby provide high isolation therebetween. As a result, less power is transferred to the diode power detector 24, thereby preventing the diode power detector 24 from saturating. In addition, the loose coupling further prevents the diode power detector 24 from interfering with the power flow of the output signal 16 to the load 18, thereby allowing for increased power transfer when power is needed most.

Likewise, when the amplifier 12 is operating at low power settings, the variable coupling network 52 is directed by the isolation control voltage signal 54 via microcontroller 28 and Digital-to-Analog converter 60 to provide for a tight coupling between the amplifier 12 and the diode power detector 24. This tight coupling thereby diverts more power from the load 18 to the diode power detector 24. As a result, the diode power detector 24 receives enough power to keep the detection voltage relatively high as compared to the temperature induced voltage so as to avoid any undesirable erroneous power detection.

The diode power detector 24 may be constructed with a Schottky diode type MMBD101 available from Motorola. Schottky diodes are generally preferred for applications involved RF and microwave detectors because they provide for good frequency responses and a relatively inexpensive cost. However, at other frequencies it may be more desirable to employ other types of diodes. As such, other types of power detectors may be employed without departing from this invention.

The diode power detector 24 receives a sample signal 22 which is a function of both the amplifier output signal 16 and the isolation control voltage signal 54. The diode power detector 24 thereby rectifies the sample signal 22 and provides as an output, a DC output signal 26. Both the sample signal 22 and DC output signal 26 are substantially constant even though the output signal 16 can vary over a dynamic range of 30 dB or more. The DC output signal 26 is then compared with a fixed voltage reference 30 by way of voltage comparator 32. The fixed voltage reference 30 is a band-gap type of voltage reference integrated circuit which provides a stable voltage independent of temperature variation.

The voltage comparator 32 provides as an output, an error voltage 34. The error voltage 34 may be provided to a bias driver 36 which further receives a supply voltage $V_s$. The bias driver 36 generates a bias control signal 38 which is provided to the bias control input 40 of the amplifier 12 to adjust the gain thereof. Alternately, the error voltage 34 may be input to an attenuator circuit 56. The attenuator circuit 56 thereby provides an attenuation signal 58 which is added to the input signal 14 for purposes of adjusting the output signal 16 of the amplifier 12. This alternate technique which employs the attenuator circuit 56 may be most advantageous when the amplifier 12 does not have a bias control input 40. However, both the attenuator circuit 56 and the bias driver 36 may be employed together if desired.

The preferred embodiment of the variable coupling network 52 is illustrated in FIG. 3. The variable coupling network 52 has a DC block capacitor C1 connected to the output of amplifier 12 which receives the output signal 16. The variable coupling network 52 further has a resistor R1 which is connected to the Digital-to-Analog converter 60 for receiving the isolation control voltage signal 54 therefrom. A varactor 62 is provided which has an input connected to the DC block capacitor C1 and resistor R1 for receiving signals therefrom. The varactor 62 has an output that is DC grounded by an RF choke 58 fed to ground. The RF signal 22 at the output of varactor 62 is essentially the output of the variable coupling network 52. The output of varactor 62 is connected to the diode power detector 24 via a DC block capacitor C2. The diode power detector 24 generates a rectified current which is converted to a voltage by a resistor R3. A capacitor C3 further shunts to ground any residual RF signal that exists at the output of the diode power detector 24 thereby leaving only the DC output signal 26.

The varactor 62, which acts like a voltage controlled capacitor, operates in a manner such that the RF impedance through the varactor 62 is a function of the voltage impressed across it. A higher isolation control voltage 54 causes the varactor 62 to behave like a small capacitor, turning the variable coupling network 52 into a high impedance path. As a result, a higher isolation is achieved. Likewise, a lower isolation control voltage 54 causes the varactor 62 to behave like a large capacitor thereby resulting in a lower isolation. As a result, the power diverted through the variable coupling network 52 is controlled as a function of the isolation control voltage signal 54.

In operation, the controlled-output amplifier 50 receives an input signal 14 that is provided to the amplifier 12. The amplifier 12 thereby provides an amplified output signal 16 to a desired load 18. The variable coupling network 52 receives a sample of the output signal 16. The variable coupling network 52 further receives an isolation control voltage signal 54 via the microcontroller 28 and the Digital-to-Analog Converter 56. The variable coupling network 52 then provides one of a plurality of previously calibrated amounts of isolation between the amplifier 12 and the power detector 24. The sample signal 22 is rectified by the diode power detector 24 to provide the DC output signal 26 whose voltage is proportional to sample signal 22. The DC output signal 26 will deviate from its normal value if the output signal 16 deviates from its selected power setting. The DC output signal 26 is then compared with the fixed voltage reference 30 via voltage comparator 32. The voltage comparison provides an error voltage 34 which is used to adjust the gain of the amplifier 12 via a bias driver 36 and/or is provided to an attenuator circuit 56 for adjusting the amplitude of the input signal 14. In any event, the error voltage 34 is used to adjust the signal gain from input 14 to output signal 16 of the amplifier 12 so as to achieve a desired output power.

The controlled-output amplifier 50 described herein functions as a sort of closed-loop control system. The closed-loop nature of the control system essentially acts in such a manner as to create an equality condition to exist in the voltage comparator 32 such that the DC output signal 26 will equal the fixed voltage reference 30. When the equality condition exists, the amplifier output signal 16 remains at the desired power setting. If the amplifier 12 outputs a different power level on output signal 16 from the requested power setting due to abnormally high or low gain of amplifier 12 (i.e., such as a condition arising from an abnormally high or low supply voltage) the DC output signal 26 will be correspondingly higher or lower than the fixed voltage reference 30. This will cause the voltage comparator 32 to increase or decrease the error voltage 34, resulting in an increase or decrease in gain of amplifier 12. As a result, the loop is forced back to its equilibrium point thereby maintaining the desired power level setting on output signal 16.

Figure 4:
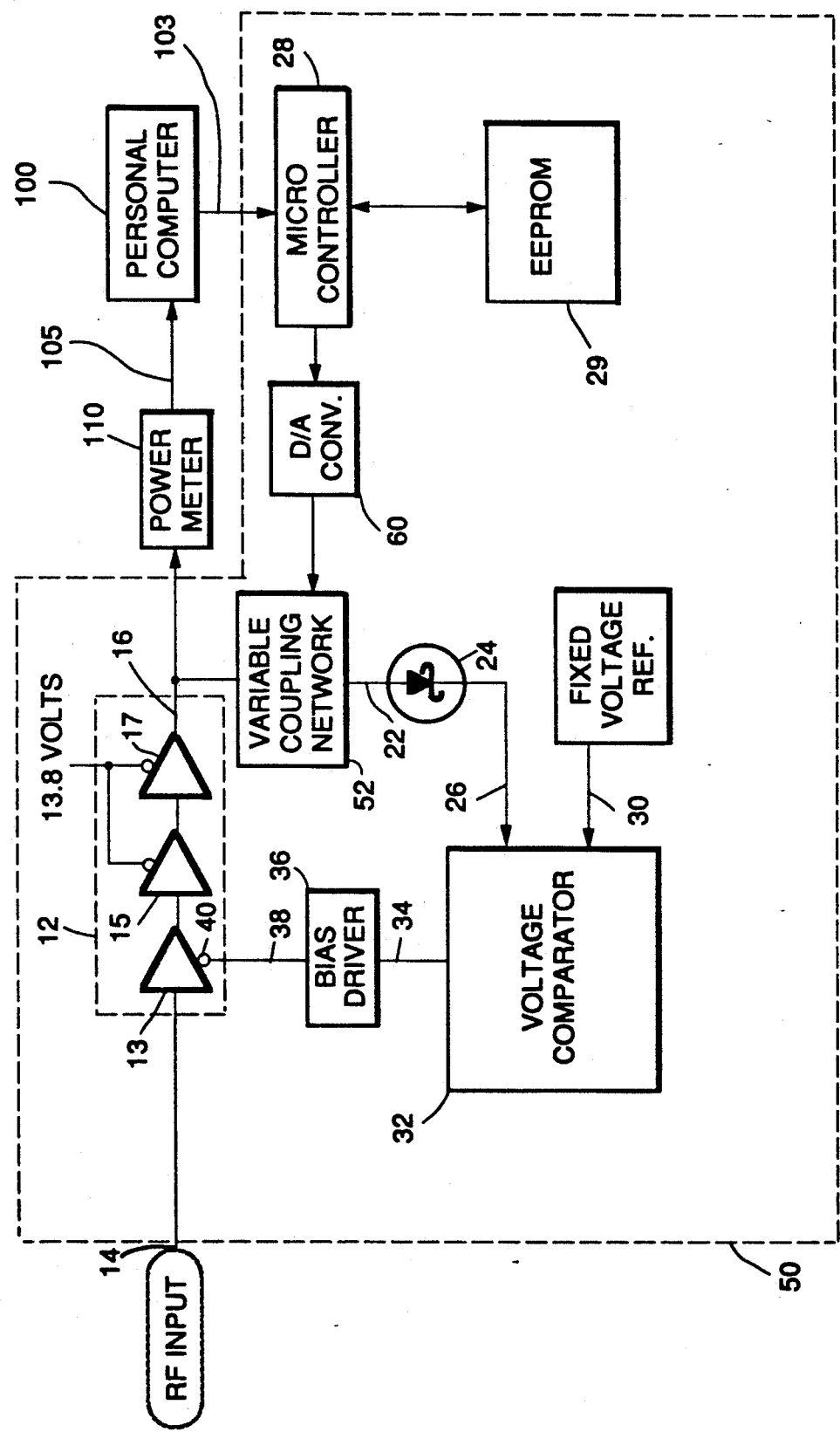
FIG. 4 is a block diagram which illustrates the calibration of the controlled-output amplifier.
Figure 5:
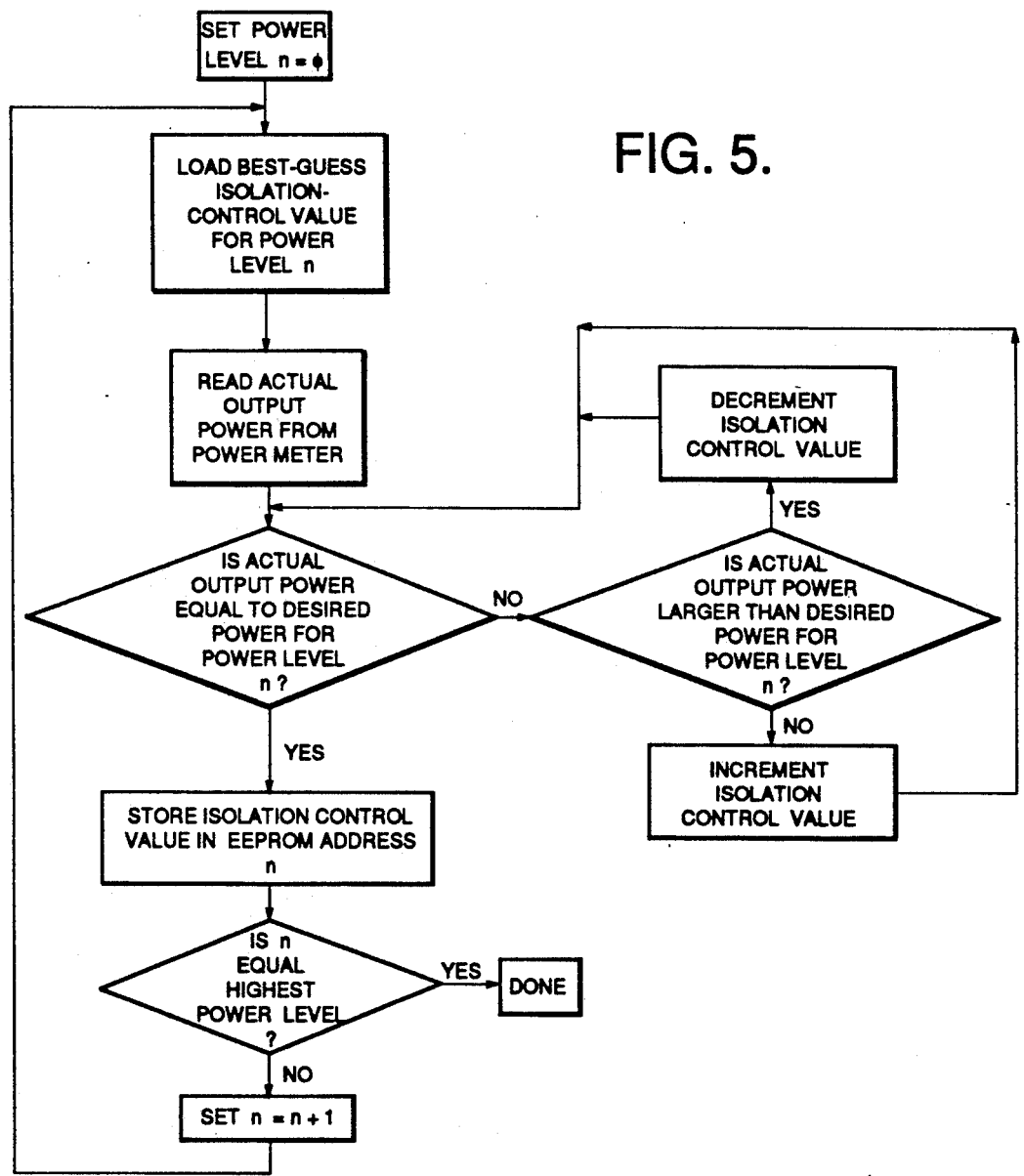
FIG. 5 is a flow diagram which illustrates a computer calibration algorithm for calibrating the controlled-output amplifier.

The controlled-output amplifier 50 initially undergoes a production calibration procedure. The calibration procedure is shown in FIG. 4 in which the controlled-output amplifier 50 is connected to a personal computer 100 via a parallel interface 103. The load 18 is replaced with a power meter 110 whose reading can be read by the personal computer 100 via a GPIB (general purpose interface bus) 105. From this setup, the personal computer 100 writes a binary number which is a best guess number for a particular power setting, starting with the lowest power setting #0. An algorithm such as that shown in FIG. 5, is stored in the disk memory of computer 100. The algorithm proceeds with incrementing or decrementing the binary number via microcontroller 28 and the Digital-to-Analog Converter 56 which sets the amount of isolation in the variable coupling network 52 while monitoring the power meter 110. When the correct reading from the power meter 110 is reached, the binary number is stored in memory location #0 of the EEPROM 29. The algorithm then repeats the aforesaid steps for the remaining seven power settings (for the case of the cellular radio) and stores the corresponding calibration numbers in the EEPROM 29 memory locations one through seven. FIG. 5 shows the flow diagram of the computer calibration algorithm for the amplifier 50.

In view of the foregoing, it can be appreciated that the present invention enables a user to achieve an automatic controlled-output amplifier 50 having a wide dynamic range. Thus, while this invention has been disclosed herein in connection with a particular example thereof, no limitation is intended thereby except as defined by the following claims. This is because the skilled practitioner will recognize that other modifications can be made without departing from the spirit of this invention after studying the specification and drawings.

What is claimed is:

1. An amplifier power control circuit comprising:
   an amplifier having an input for receiving an input signal and an output for providing an output signal;
   power detector means for receiving a sample signal representative of the amplifier output signal, said power detector means rectifying said sample signal to thereby provide for a DC output signal;
   variable coupling means coupled between the output of said amplifier and said power detector means for providing the sample signal to said power detector means, said variable coupling means receiving said amplifier output signal and an isolation control signal and providing in response a variable amount of isolation between the amplifier output and said power detector means, such that the sample signal provided therefrom is a function of the power level of the output signal;
   comparator means for comparing the DC output of said power detector means with a reference voltage to obtain an error voltage;
   means for adjusting the output of said amplifier in relation to said error voltage to thereby maintain a desired amplifier output signal;
   means for storing a plurality of isolation voltages, each isolation voltage being representative of a given range for the amplifier output signal; and
   controller means for providing one of said isolation voltages, as said isolation control signal to said variable coupling means.

2. The circuit as defined in claim 1 wherein said variable coupling means for providing the variable amount of isolation includes:
   means for receiving the output signal and said isolation voltage and controlling the resistance therethrough as a function of the power signal level applied thereto.

3. The circuit as defined in claim 2 wherein said variable coupling means includes a varactor for adjusting the resistance as a function of the voltage impressed thereon.

4. The circuit as defined in claim 1 wherein said means for adjusting the output of said amplifier comprises:
   a bias driver for receiving said error voltage and for providing a bias control signal to said amplifier to adjust the gain of the amplifier so as to obtain the desired amplifier output signal.

5. The circuit as defined in claim 1 wherein said means for adjusting the output of said amplifier comprises:
   attenuator means connected between said voltage comparator and the input of said amplifier for receiving said error voltage and providing an output to said amplifier input to thereby adjust the amplifier output.

6. The circuit as defined in claim 1 wherein said power detector means comprises a diode power detector.

7. The circuit as defined in claim 6 wherein said diode power detector comprises a schottky diode.

8. A controlled-output power amplifier for providing power output control over a wide dynamic range, said controlled-output amplifier comprising:
   a power amplifier having an input for receiving an input signal and an output for providing a power output signal;
   power detector means for receiving a sample signal representative of the amplifier output signal, said power detector means rectifying said sample signal to thereby provide for a DC output signal;
   variable coupling means coupled between the output of said amplifier and said power detector means for providing the sample signal to said power detector means, said variable coupling means receiving said amplifier output signal and an isolation control signal and providing in response a variable amount of isolation between the amplifier output and said power detector means, such that the sample signal provided therefrom is a function of the power level of the output;
   control means for providing said isolation control signal, said isolation control signal controlling the amount of isolation provided for a given range of output signals;
   comparator means for comparing the DC output of said power detector means with a reference voltage to obtain an error voltage;
   adjustment means for adjusting the output of said power amplifier in relation to error voltage so as to maintain a desired amplifier output signal; and
   means for storing a plurality of isolation voltages, each isolation voltage being representative of a given range of amplifier output signals.

9. The controlled output power amplifier as defined in claim 8 wherein said variable coupling means includes a varactor for providing said isolation by adjusting the resistance therethrough as a function of the voltage impressed thereon.

10. A method for providing automatic power output control for an amplifier over a wide dynamic range, said method comprising:
    receiving an input signal;
    amplifying said input signal with a power amplifier to provide an RF power output signal;
    coupling the output of said power amplifier to a variable coupling network which receives said output signal and an isolation control signal and provides in response a variable amount of isolation therein, said variable coupling network further providing a sample signal therefrom;
    rectifying the sample signal provided from said variable coupling network with a power detector to thereby provide a DC power signal;
    comparing the DC power signal with a reference voltage to obtain an error voltage;
    adjusting said power amplifier in relation to said error voltage so as to maintain a desired power output signal;
    storing a plurality of isolation voltages, each isolation voltage being representative of a given range of amplifier output signals; and
    providing one of said isolation voltages as the isolation control signal.

11. The method as defined in claim 10 wherein the step of adjusting said power amplifier comprises:
    providing said error voltage to a bias driver; and
    adjusting the bias of said power amplifier to thereby adjust the gain of said amplifier.

* * * * *